United States Patent [19]
Rochet et al.

[11] Patent Number: 4,805,759
[45] Date of Patent: Feb. 21, 1989

[54] INSTALLATION AND METHOD FOR HANDLING DELICATE OBJECTS IN AN ATMOSPHERE HAVING A CONTROLLED DUST CONTENT

[75] Inventors: André Rochet, Meylan; Guy Dubois, St. Etienne de Crossey; Louis Faure, Fontaine; Alain Lalanne, Isnier, all of France

[73] Assignee: Societe pour l'Etude et la Fabrication de Circuits Integres Speciaux EFCIS, Grenoble, France

[21] Appl. No.: 2,631
[22] PCT Filed: Apr. 2, 1986
[86] PCT No.: PCT/FR86/00112
   § 371 Date: Dec. 8, 1986
   § 102(e) Date: Dec. 8, 1986
[87] PCT Pub. No.: WO86/06245
   PCT Pub. Date: Oct. 23, 1986

[30] Foreign Application Priority Data
Apr. 12, 1985 [FR] France .................. 85 05561

[51] Int. Cl.⁴ .............................................. B65G 47/00
[52] U.S. Cl. ................... 198/346.1; 198/493; 98/115.2; 15/301

[58] Field of Search ................ 198/341, 345, 346.1, 198/349, 465.1, 465.2, 803.01, 838, 845, 793, 493, 346.2; 414/222, 225, 226, 217; 98/115.2; 15/301, 310

[56] References Cited

U.S. PATENT DOCUMENTS

| | | | |
|---|---|---|---|
| Re. 28,909 | 7/1976 | Holbert | 198/793 |
| 3,803,556 | 4/1974 | Duffy | 198/349 |
| 3,958,682 | 5/1976 | Martin | 198/341 |
| 4,306,646 | 12/1981 | Magni | 198/346.1 |
| 4,616,594 | 10/1986 | Itho | 98/115.2 |
| 4,649,830 | 3/1987 | Tanaka | 414/217 |
| 4,682,927 | 7/1987 | Southworth et al. | 414/225 |

Primary Examiner—Joseph E. Valenza
Attorney, Agent, or Firm—Cushman, Darby & Cushman

[57] ABSTRACT

In an installation for conveying delicate objects such as semiconductor layers during processing operations and for handling such objects in a controlled atmosphere, wheeled carriages are drawn along tracks by an endless belt and are not driven by motors in order to satisfy conditions of cleanliness and freedom from pollution hazards. By means of transfer tools, object-holding cassettes are taken from the carriages during operation and replaced on the carriages after processing in the different machines.

12 Claims, 4 Drawing Sheets

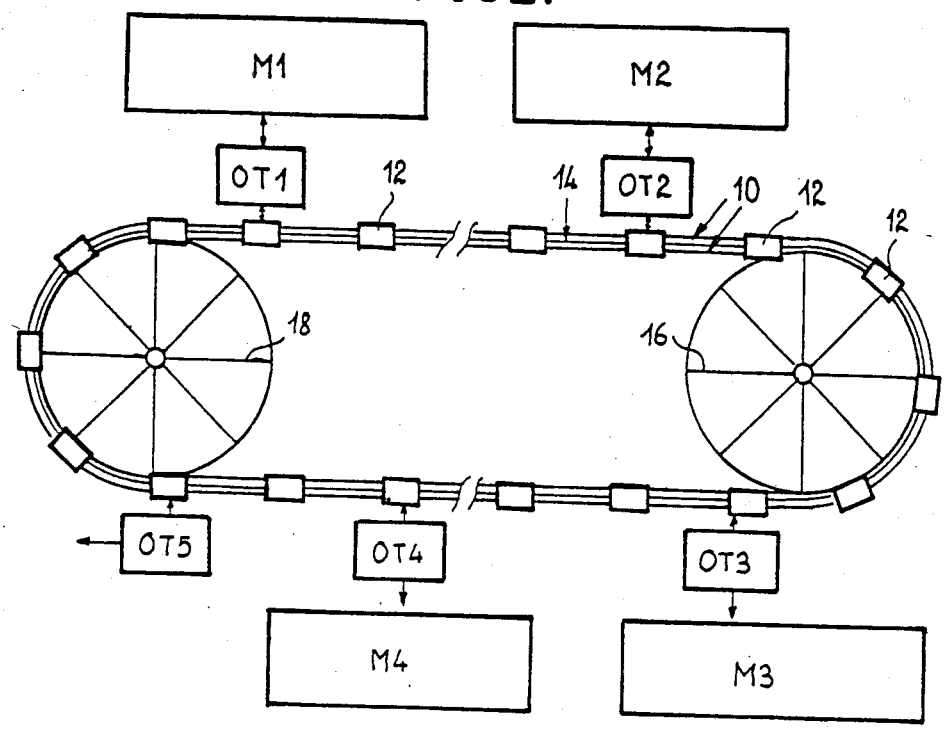
FIG_1
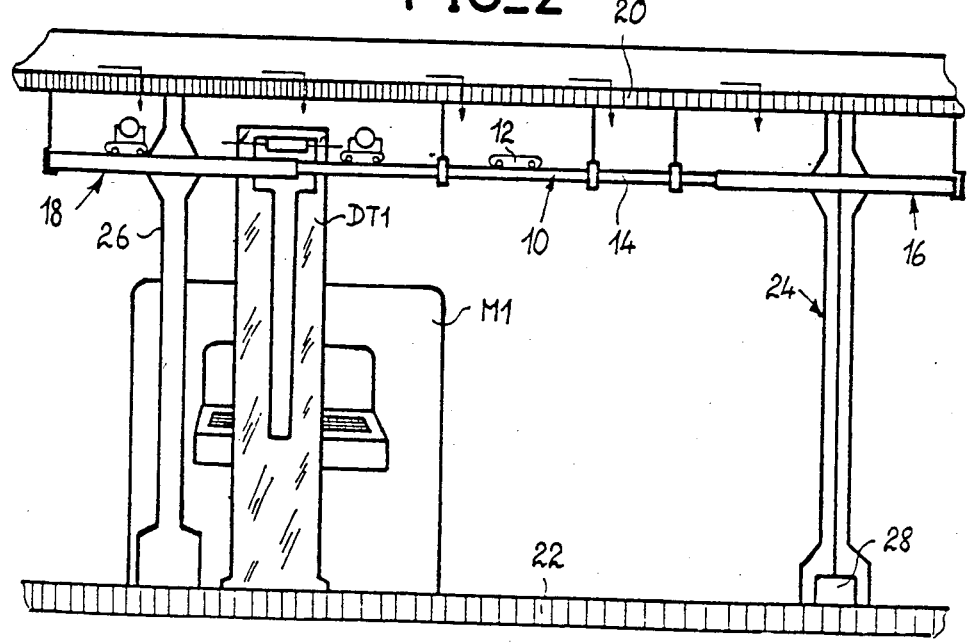
FIG_2

FIG_3
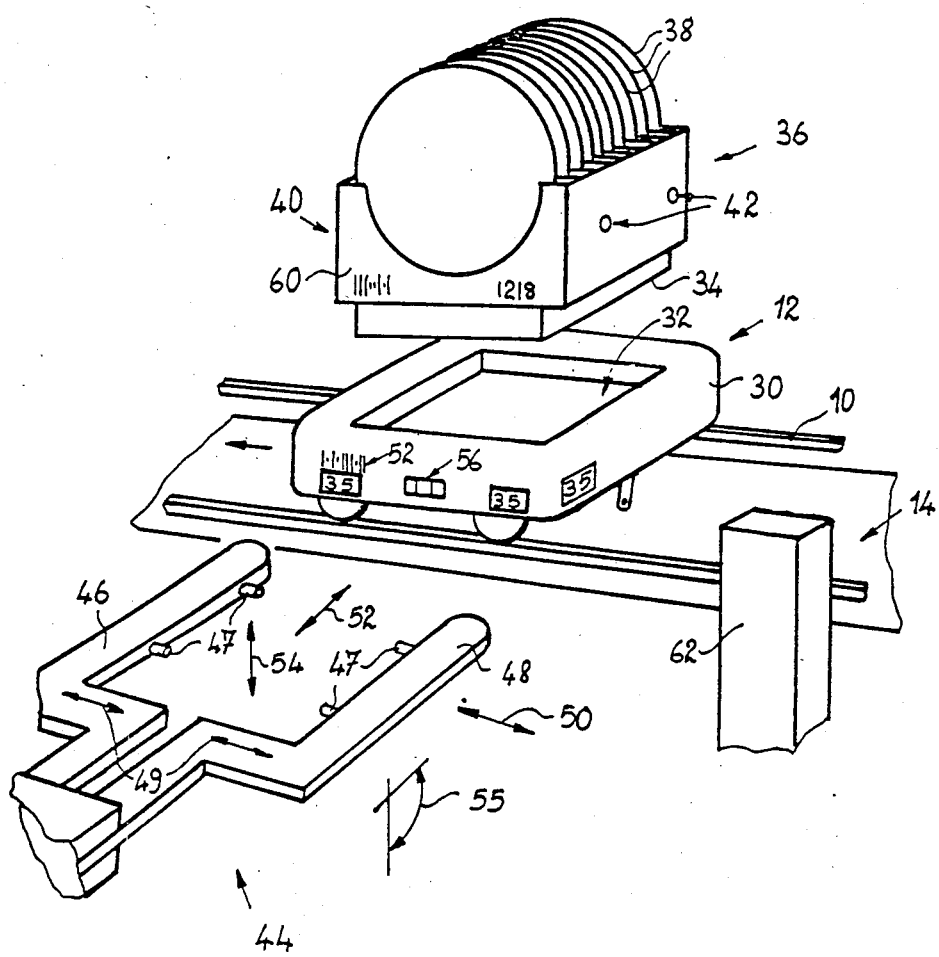

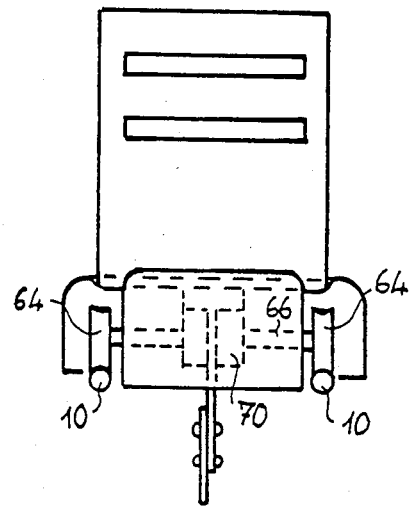
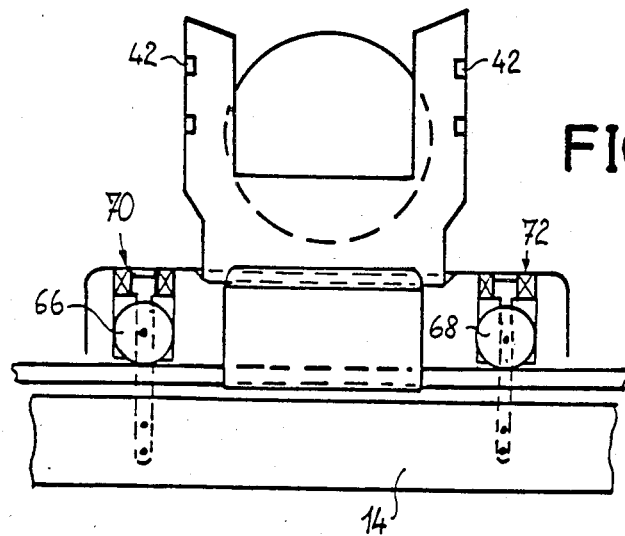
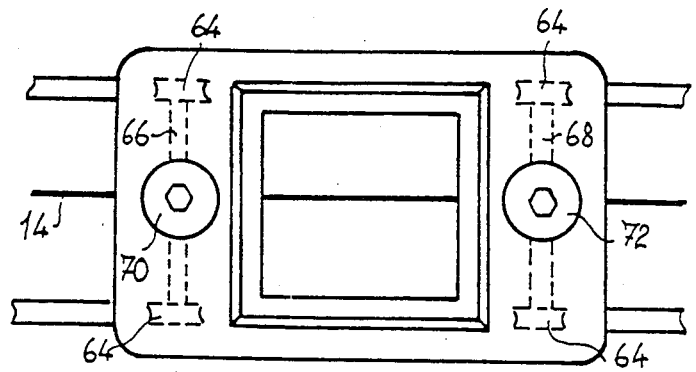

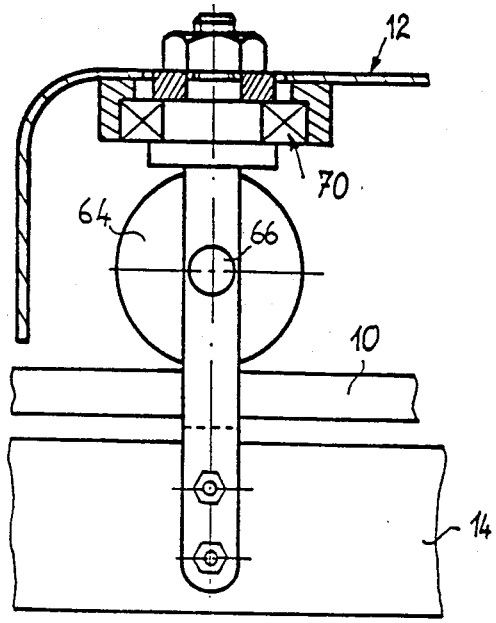
FIG_7
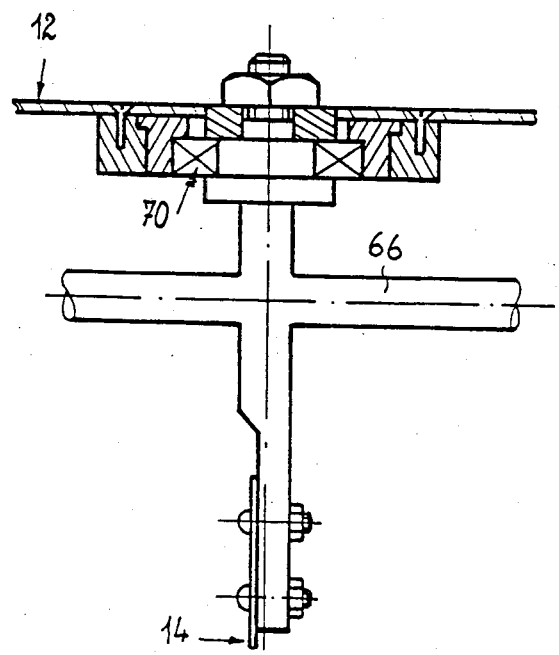
FIG_8

INSTALLATION AND METHOD FOR HANDLING DELICATE OBJECTS IN AN ATMOSPHERE HAVING A CONTROLLED DUST CONTENT

BACKGROUND OF THE INVENTION

1. Field of the Invention

The present invention relates to handling (transport and storage) of objects during manufacture.

2. Description of the Prior Art

Efforts are being increasingly directed to automating the manufacture of all kinds of objects as completely as possible with a view to reducing production costs while achieving enhanced reliability of the products obtained.

Certain stages of manufacture have in fact been largely automated for the mass production of some types of objects. This is the case, for example, in operations involving assembly of simple component parts which are relatively sturdy and little affected by environmental conditions. Where parts of this type are concerned, the automation problems presented by operations involving cutting, bonding, welding, screwing and so on have been fairly satisfactorily solved.

In most installations, the objects being produced are transported from one workstation to another by a belt conveyor (traveling band) on which the objects rest. When an operation on a first object is completed at one workstation, the object is re-taken by the conveyor. The following object arrives and is thrust forward to the workstation in order to undergo the same treatment. In the meantime, the first object is transported by the conveyor to the following workstation a which it is subjected to another treatment operation without delay or after a waiting period which is as short as possible since the parts are processed in the order of arrival on the conveyor. If the individual workstations are correctly automated, it is possible to achieve a very high degree of automation. This presupposes, however, that the objects to be processed are of rugged design,
that they are capable of withstanding any impacts against each other when there is a waiting line at the input of a workstation,
that they are capable of withstanding accelerations or decelerations caused by the often abrupt displacement of the conveyor as it moves in front of a stationary workstation and conversely,
that all the objects are subjected to the same processing operations in the order of successive workstations along the conveyor,
that the processing operations performed at each workstation have approximately identical timedurations.

On the contrary, automation presents particularly difficult problems under circumstances in which:

the objects to be handled are mechanically delicate or fragile,
the individual manufacturing operations require long periods of time which are very different from each other,
the operations do not necessarily follow in the same order for the different objects or batches of objects to be manufactured.

An additional difficulty arises when the objects have to remain in a controlled clean atmosphere (in particular a dust-free environment), not only during successive processing operations but also between these operations.

The fabrication of integrated circuits accumulates these difficulties in its first production stages or in other words throughout all the processing steps carried out on semiconductor layers before they are cut into individual chips and encapsulated within a sealed package. It is for this reason that many difficulties are encountered when automating these initial processing steps whereas it proves much easier to control the automation of the following steps and in particular the assembly of an integrated circuit in a package.

However, automatic processing of semiconductor layers on an industrial production basis is a particularly desirable objective. Although it is true that, in practice, the atmosphere of production workshops is maintained in a highly controlled state of cleanliness, the coming and going of operating personnel represents an inevitable source of pollution which considerably reduces production yields.

Various specific systems for handling semiconductor wafers have been proposed. These systems are not built on the general principle of conventional belt conveyors for at least three reasons which arise from the foregoing remarks. In the first place, semiconductor wafers are too delicate. Secondly, processing times are too long and too variable from one processing step to the next (from several tens of minutes to several hours). Furthermore, a requirement to be met is that the semiconductor wafers should not all follow the same series of treatments. It is also desirable to ensure that the batches can subsequently return to a machine through which they have already passed. For example, it may be necessary to perform several ion implantations with other operations such as photolithography in between. If only one implanter is available, the semiconductor wafers have to be returned to the implanter several times, which is virtually impracticable on an industrial scale when using a conventional belt-conveyor assembly line.

Particular stress should be laid on the fact that, in processes for the fabrication of integrated circuits, a crucial problem is encountered in the intermediate storage of semiconductor wafers precisely by reason of the very long duration of certain operations. It is thus necessary to make provision for storage locations in which a batch of semiconductor wafers can await completion of processing of a preceding batch by a machine before being in turn brought to that machine. The storage operation is itself not readily compatible with the conventional arrangement of automated assembly lines, that is, with the use of belt conveyors for transporting objects in sequence from a first workstation to a final workstation.

It is for the reasons stated above that the handling systems proposed for taking into account the specific requirements of processing of integrated circuit wafers mostly have the following features in common: they make use of motor-driven carriages for transporting batches of wafers from one location to another. These carriages are guided mechanically by rails or electronically by optical or electromagnetic tracks marked-out on the plant-shop floor. Track switches are provided for ensuring that the carriages do not follow an unvarying closed-loop path but are capable on the contrary of moving towards either one machine or another, or else towards an intermediate storage magazine. It is essential to note that the carriages are all motor-driven in order to be self-propelled. An individual carriage is thus capable of moving from one machine to another and accurately stopping in front of a machine or a magazine for carrying out loading or unloading of semiconductor wafers without interfering with the movements of the other carriages.

Each motor-driven carriage accordingly has to be equipped with a sophisticated electronic system for the purpose of controlling their displacements (as a function of the batches being transported) and particularly of ensuring highly accurate control of stopping at the precise location at which each carriage can cooperate with a machine for effecting a transfer of semiconductor wafers. In some systems, the carriages become true autonomous robots.

Since the carriages are numerous, this accordingly gives rise to a major problem of reliability. Thus the occurrence of a failure in a carriage is liable to produce a considerable disturbance in the entire industrial process since the failure has the effect of stopping not only the carriage considered but also the other carriages which are moving on the same path.

Apart from the problem of reliability, the present Applicant considers that these handling systems suffer from a much more serious disadvantage in regard to the difficulty involved in maintaining a sufficiently clean ambient atmosphere around the semiconductor wafers when they are being transported by a carriage equipped with an electric motor. The motors have parts which are in frictional contact (for current collection) and thus produce metallic dust particles as well as sparks. On the whole, they are the cause o substantial pollution which it would be practically impossible to eliminate to a sufficient extent by any means other than enclosing the semiconductor wafers in air-tight boxes while they are being transported. By making use of air-tight boxes, however, the introduction of the semiconductor wafers within the processing machines would become a very complex procedure. Without such an air-tight box, the pollution produced mainly by the motors is too great, even if the wafers are maintained in a dedusted airstream (the heat of the motors would in any case perturb this airstream).

It is clearly apparent from all the foregoing considerations that very significant constraints of many different kinds make it difficult to achieve automation in the handling of certain products such as integrated circuit wafers while fabrication is in progress.

In order to provide the most satisfactory solution to these problems, the present invention proposes a handling installation which is organized in an entirely different manner to those proposed up to the present time.

SUMMARY OF THE INVENTION

The installation for handling delicate objects to be maintained in an atmosphere having a controlled dust concentration is intended to perform the following operations:
- conveying of objects between processing machines,
- introduction of objects into the machines and withdrawal of said objects therefrom,
- temporary storage of objects between two successive processing operations.

This installation includes a series of motorless carriages adapted to run on rails on a closed-loop path which passes in proximity to the machines, the carriages being attached at intervals to an endless traction belt driven at constant speed by a pulley along a path which is parallel to the rails. The traction belt, the rails and the pulley are placed beneath a source of dedusted air delivered in a downflowing stream, the pulley being driven by a motor which is placed beneath this latter and enclosed within a cowling. The top portion of each carriage is provided with a housing for removably inserting therein a cassette containing the objects. Automatic transfer tools are placed in proximity to the rails for taking cassettes from the carriages or replacing them in vacant carriages. Each transfer tool has a gripper head which is capable of translational displacement in a direction parallel to the direction of travel of the carriages and an electronic system for controlling the movement of the head, said system being capable of detecting the position of a carriage, controlling the movement of the head in dependence on that of the carriage and carrying out a transfer of a cassette from carriage to gripper head or conversely during the synchronous movement of the carriage and of the head. An identification means is associated with each carriage and recognizable by an electronic detection device placed upstream of the gripper head of a transfer tool and electrically coupled with this latter. The installation is finally provided with a data processor in cooperating relation with the transfer tools for ensuring transfer of a cassette by a transfer tool at the beginning and end of a processing operation to be carried out on said cassette and temporary storage of cassettes in the moving carriages between successive processing operations.

The handling arrangement defined in the foregoing is applicable to a workshop installation consisting of a number of machines placed around a closed-loop system of guide rails. It is apparent, however, that a more complex industrial handling facility may include a number of workshops each having its closed-loop system with possibilities of transfer between the corresponding loop systems. In such a case, transfer tools can also be provided for transferring a cassette, not from a carriage to a machine but from said carriage to a carriage of another loop system.

By virtue of the fact that an important aspect of the invention lies in the elimination of frictional contacts which cause pollution, means will be provided for ensuring that the carriages are supported by wheels mounted with ball-bearings about horizontal shafts which are in turn capable of pivotal displacement about a vertical axis. The wheels will thus remain continuously parallel to the rails even in the non-rectilinear portions of the path followed by these latter.

Finally, the carriages will if necessary be streamlined in order to minimize disturbances of the airstream in which they are placed.

It is worthy of note that the system proposed in accordance with the invention provides the possibility of placing the rails directly beneath a ceiling which constitutes a uniform source of dedusted airflow. This would clearly not be possible with a conveyor of the traveling band type in which the airstream would simply impinge upon the conveyor band and thus set up considerable disturbances in the airstream. In the system proposed, the rails and streamlined carriages located in spaced relation cause low disturbance and can effectively be placed in a dedusted airstream which includes the possibility of a laminar flow of dedusted air.

BRIEF DESCRIPTION OF THE DRAWINGS

FIG. 1 is a schematic top view of the installation in accordance with the invention.

FIG. 2 is a view in elevation showing the same installation.

FIG. 3 is a perspective view of a carriage and a gripper head

FIGS. 4, 5 and 6 are respectively a transverse sectional view, a longitudinal sectional view and a top view showing one example of a carriage adapted to the installation in accordance with the invention.

FIGS. 7 and 8 are respectively a side view and a front view showing the mode of attachment of the carriage to the conveyor belt.

In view of the fact that the invention relates essentially to the general structural design of the installation in accordance with the invention, it is not necessary to describe all the details of mechanical construction which can be extremely varied and depend not only on the objects to be transported but also on the production machines considered, on the premises in which the production or fabrication process is carried out, and so on.

DETAILED DESCRIPTION OF THE INVENTION

FIG. 1 illustrates the general arrangement of a workshop forming part of the handling installation in accordance with the invention as applicable to the processing of semiconductor wafers.

There are shown in this figure four processing machines represented schematically by rectangular blocks M1, M2, M3, M4 and supplied by the handling installation as seen from above.

This installation includes a transport line which travels on a closed-loop path, and transfer tools. In the example illustrated, provision is made for five transfer tools designated by the references OT1, OT2, OT3, OT4, OT5, each tool being placed in proximity to the transport line and in proximity to a respective processing machine so as to permit transfer of parts between the transport line and the machine. The fifth transfer tool can be placed for example between the line and another line (not shown) for effecting a transfer between the two lines.

The transport line is a line of drawn carriages mounted on wheels but not provided with individual motors.

The line of drawn carriages includes guide rails 10 on which rest wheeled carriages 12 and a traction belt 14 or endless belt to which the carriages are attached at intervals. Said carriage traction belt 14 is driven at constant speed on a path which is parallel to that of the rails, for example between two parallel rails. Driving pulleys 16 and 18 also serve to apply tension to the belt 14 and to guide this latter, one of the pulleys being driven by a motor. The top portion of each carriage is provided with a location for positioning a cassette containing a batch of semiconductor wafers.

FIG. 2 represents one aspect of the installation as seen in elevation.

This installation is preferably placed within a "white room", which is the name given to a room having a highly controlled atmosphere. For example, the room has a cellular ceiling 20 through which is blown a dedusted airstream which is controlled in temperature, moisture content and composition. The flow of air takes place vertically in the downward direction and is preferably laminar. The room is also provided with a cellular floor 22 through which the air passes and is then recovered.

The guide rails can be suspended at uniform intervals in proximity to the ceiling by means of hooks secured to the ceiling. In this manner, the parts to be processed circulate beneath the supply of dedusted air.

The pulleys are supported at the same height as the guide rails and can be attached either to the ceiling or to the floor. In FIG. 2, the pulleys are shown as being mounted on vertical shafts which are in turn mounted between ground level and floor. The shafts are housed within protective cowlings 24 and 26 and the drive motor 28 with its reduction-gear unit is also housed within one of the cowlings and preferably placed at the extreme lower end.

In FIG. 2, only one machine M1 has been shown in order to avoid unnecessary complication of the drawing, together with a corresponding transfer tool OT1.

In regard to the transfer tool, its construction essentially depends on the objects to be transported, on the possibilities of reception of the objects within the processing machines, on the shape of the cassettes which contain the semiconductor wafers and which are to be taken from the carriages and put back in position on these latter. The following description will therefore not give details of construction of these tools but simply the principal characteristics required by those skilled in the art in order to construct said tools as well as a simplified form of execution which is given solely by way of example.

The transfer tool is relatively simple inasmuch as it does not need to be a true manipulator robot (a manipulator robot would entail the need for possibilities of displacement along six or seven different axes). The tool will have a gripper head which is capable of moving in three axes or directions, one of the directions being parallel to the direction of forward travel of the carriages. The most simple design is of the "traveling bridge" type (three directions of translation at right angles to each other).

For example, the transfer tool will have a gripper head which is capable of moving in a first direction parallel to the path of the carriages which pass in front of the tool. This head is also capable of moving in a second and horizontal direction at right angles to the path of the carriages and in a third direction which is vertical.

FIG. 3 is a perspective view showing one example of a carriage structure with a semiconductor layer cassette and a gripper head. These three elements have been separated from each other for enhanced clarity of the drawing. In practice, however, the cassette will rest either on the carriage or on the gripper head.

In this example, the carriage has a frame 30 which is streamlined in order to facilitate the downward flow of dedusted air. A rectangular recess 32 is provided at the top of the frame 30 and serves as a housing for the rectangular base 34 of a cassette 36 which carries a batch of semiconductor wafers 38.

The semiconductor wafers are placed vertically in order to facilitate the flow of air and the housing 32 is preferably provided in addition with a bottom opening for the same reason (similarly, it is assumed that the cassette 36 also has a large bottom opening between the semiconductor wafers).

The cassette 36 is provided with engagement means which are intended to cooperate with the gripper head in order to permit either pickup or placing of a cassette within the housing 32, pickup and placing of cassettes being performed without interruption of travel of the carriage which is drawn by the traction belt 14.

In the example shown, the engagement means are extremely simple and consist of horizontal holes 40 and 42 formed on each side of the cassette (in the side walls located at right angles to the direction of forward travel of the carriages).

The gripper head which is designated by the reference 44 is composed of a tong unit having two horizontal arms 46 and 48 provided with projecting horizontal studs 47. The arms are each capable of passing along one side wall of the cassette, then of drawing together in a closing movement so as to insert the studs 47 within the holes 40 and 42. During the movements of the gripper head, the arms 46 and 48 remain horizontal (in practice, they are located in the same horizontal plane), with the result that the cassette retains a fixed orientation when it is taken from or deposited on a carriage by the gripper head. The movement of opening and closing of the arms 46 and 48 is indicated by arrows 49.

The four independent movements which can be performed by the gripper head 44 are indicated by four arrows 50, 52, 54, 55. These movements as well as opening and closing of the tong unit 46, 48 are controlled by an electronic system which forms part of the transfer tool. It should be added that the different transfer tools transmit and receive information and instructions to and from a general dataprocessing unit for the workshop or for the entire production line.

These four movements are preferably a longitudinal horizontal translation 50, a transverse horizontal translation 52, a vertical translation 54, and a rotation 55 from 0° to 90° in a vertical plane.

The gripper head 44 is provided with a carriage-position detector in cooperating relation with locating means placed on the carriage (or on the traction belt if so required). For example, the locating means are constituted by a pattern of black and white marks 56 whilst the position detector includes a plurality of photoelectric cells and an optical focusing system.

A pickup operation which consists in taking a cassette from a carriage is performed as follows: the detection head is initially in a position and at a height which enable the position detector to recognize the locating marks. The electronic system for controlling the transfer tool includes a servo system which has the function of setting the detection head in motion in the longitudinal direction 50 (parallel to the path of travel of the carriage) so as to attain the same speed as the carriage, thereby ensuring that the position detector is centered and remains centered on the locating marks. During the synchronous displacement of the carriage and the head, said head is moved into position in the transverse direction 52 (the horizontal direction at right angles to the path of the carriage) and the arms 46 and 48 of the tong unit are closed with introduction of the studs 47 into the holes 42 of the side walls of the cassette. The synchronous movement in the longitudinal direction continues and an upward vertical movement (arrow 54) is applied in order to lift the cassette which can then be separated from the carriage. From that point on, the movements of the gripper head are dictated only by the location to which the cassette is to be transported. The rotation 55 in the vertical plane makes it possible in particular to deposit the cassette.

Placing of a cassette on a carriage takes place in a wholly similar manner, namely by subjecting the gripper head first to a longitudinal movement which is synchronous with the movement of the carriage and then, during the synchronous longitudinal movement, to a transverse movement towards the carriage followed by a downward vertical movement. Finally, another transverse movement is performed in order to withdraw the fork after the tong unit 46-48 has been opened. On completion of this sequence, the synchronous longitudinal movement can be interrupted and the gripper head can revert to a standby position in which a further detection of a carriage transfer can take place.

In order to identify the carriages (as well as the cassettes if necessary), provision will be made for identification marks and for a device having the function of recognizing these identification marks (for example, a fixed recognition head placed in immediate proximity to the path of travel of the carriages, upstream of the gripper head). The identification marks can consist of a bar code 58 on the carriage and/or a bar code 60 on the cassette. The recognition device 62 can form part of the transfer tool or else it may be separate, in which case it is connected electrically to the transfer tool for ensuring that a movement of the gripper head 44 for placing or picking-up a cassette is accomplished only if it corresponds to a specifically determined carriage which has been recognized upstream of the gripper head. Arrangements can be made for ensuring that the identification information delivered by the recognition device is processed by a microprocessor which is dedicated to management of the entire workshop and sends an order to the transfer tool for picking-up or placing a cassette at a moment corresponding to the passage of a precisely designated carriage. The electronic system for controlling the transfer tool ensures that the entire pickup or placing operation proceeds to completion from the instant the order is received.

The head for recognition of the identification marks can be a conventional bar-code read head if the identification marks are bar codes.

Intelligible identification marks will also be provided on the carriages and on the cassettes in order to permit manual repairs or servicing without causing any disturbance. The carriages will thus have consecutive numbers so as to permit high-speed location for picking-up or placing a cassette, if necessary after interrogation of the management microprocessor in order to determine the particular carriage on which it is necessary to pick-up or place a cassette having a predetermined number.

The simplified views of FIGS. 4, 5 and 6 are respectively a transverse cross-section, a longitudinal cross-section and a top view showing one example of construction of a wheeled carriage which is well-suited to the installation in accordance with the invention. FIGS. 7 and 8 show constructional details of the carriage.

The traction belt 14 to which the carriages are attached is preferably a stainless steel strip. The guide rails 10 can have a rectangular or a round cross-section, a round shape being conducive to a reduction in friction forces. The wheels 64 of the carriage have grooves which facilitate lateral guiding of the carriage.

Said carriage wheels are mounted with ball-bearings on axles consisting respectively of a front axle 66 and a rear axle 68.

The axles are in turn rigidly fixed to the traction belt 14 substantially at the center of the axles. In this manner, the axle remains permanently at right angles to the (vertical) plane of the belt even when this latter is rotating (around pulleys).

A noteworthy feature is that the carriage is supported on the axles by means of ball-bearings 70 and 72 having vertical axes, thus permitting free and frictionless rotation of the axle with respect to the carriage in a horizontal plane. These pivotal axles are of considerable assistance in reducing friction in the curves of the guide rails.

Finally, in order to prevent tensions between the carriage and the traction belt in the curved portions of the guide rails, the axle need be rigidly fixed to the traction belt only at the front end of the carriage. In this case, the rear axle is accordingly attached to the traction belt with a longitudinal degree of freedom of a few tenths of a millimeter. It would also be possible to ensure that the rear axle can be rapidly secured to the traction belt. In this case, a longitudinal degree of freedom having the same amplitude in sliding or flexural motion will be allowed between the carriage and the rear axle.

What is claimed is:

1. An installation for handling and processing delicate objects in a dedusted environment adapted to be placed in a room, comprising:
    means for introducing dedusted air into said room proximate to an upper part of said room and means for removing air from said room at a lower part thereof so as to induce a substantially vertically downward flow of laminar air in the room from said upper part to said lower part,
    a plurality of motorless carriages having cassette means removably received in said carriages for accommodating a group of objects to be processed,
    rails defining a closed-loop path located above work stations for processing said objects, said carriages having wheels in rolling contact with said rails,
    an endless traction belt adapted to be driven at constant speed parallel to said rails and having means connecting said carriages to said traction belt at spaced locations along said traction belt, said rails, said traction belt, and said carriages being located in said upper part of said room, said rails and said traction belt being located substantially immediately adjacent said means for introducing dedusted air into said room so as to be exposed to substantially vertically downward flowing laminar air free from disturbances in air flow due to said work stations and any contaminants generated by said work stations,
    motor drive means, for driving said traction belt, located in said lower part of said room, and
    automatic transfer tool means disposed in proximity to said rails for picking up cassette means from said carriages and delivering said cassette means to said work stations and/or moving said cassette means from said work stations and removing said cassette means from said work stations and returning them to said carriages.

2. An installation according to claim 1, wherein said means for introducing dedusted air comprises a perforate ceiling adapted for installation in said room, and said means for removing air from said room comprises a perforate floor adapted for installation in said room.

3. An installation according to claim 2, wherein said perforate ceiling and floor are defined by cellular openings for promoting said substantially vertically downward flow of laminar air in said room.

4. An installation according to claim 1, wherein each of said carriages has a frame which is streamlined so as to facilitate the downward flow of dedusted air in said room.

5. An installation according to claim 1, wherein each of said cassette means includes a base and accommodates a batch of vertically oriented semiconductor wafers and each of said carriages includes a frame, said frame having a top recess for receiving a cassette base and a through opening to facilitate the downward flow of air along and between said wafers.

6. An installation for handling and processing delicate objects adapted to be placed within a room having a ceiling and a floor and having processing machines located therein, comprising:
    means for blowing dedusted air downward through a large area of said ceiling and means for recovering said air in said floor beneath said means for blowing said dedusted air so as to induce a substantially vertically downward flow of laminar air in the room from said ceiling to said floor,
    means for conveying objects between said processing machines and for introduction and withdrawal of said objects from said machines and for temporary storage of said objects between processing and successive processing machines,
    a closed-loop rail located in said room in a substantially horizontal plane adjacent to and below said ceiling, said rail being located above said processing machines,
    a plurality of motorless carriages having wheels in rolling engagement with said rial, said carriages being attached at intervals to an endless traction belt adapted to be driven at constant speed by two pulleys mounted by on vertical shafts, said traction belt having a path which is parallel to and at the same level as said rail, one of said pulleys being driven by a motor and reduction gear unit located below said pulley and said traction belt, said rails and said belt being disposed substantially immediately adjacent to said ceiling so as to be exposed to substantially vertically downward laminar flowing air free from disturbances in air flow due to said processing machines and any contaminants generated by said processing machines,
    each of said carriages having a frame including a top recess for removably accommodating cassette means for containing said objects,
    automatic transfer tools disposed in proximity to said rail for removing said cassettes means from said carriages or replacing them into vacant carriages, each of said transfer tools being provided with a gripper head which is capable of translational displacement in a direction parallel to the direction of travel of the carriages and includes an electronic system for controlling the movement of said gripper head, said electronic system being adapted to detect the position of a carriage, controlling the movement of said gripper head in dependence on the movement of said carriage and transferring a respective cassette means from said carriage to said gripper head or vice versa during the synchronous movement of the carriage and said gripper head;
    identification means associated with each of said carriages and recognizable by an electronic detection device disposed upstream along said closed loop of said gripper head of said transfer tool and being electrically coupled to said tool,
    a data processor cooperable with said transfer tool for ensuring transfer of a respective cassette means by a respective transfer tool at the beginning and end of a processing operation in a corresponding process machine, and temporarily storing said cassettes means in said carriages moving along said rail between successive processing operations.

7. An installation according to claim 6, wherein said ceiling and said floor are of perforate cellular construction for favoring the downward laminar flow of dedusted air.

8. An installation according to claim 6, wherein said vertical shaft of each of said pulleys is housed in a protective cowling extending between said floor and said pulley and between said pulley and said ceiling.

9. An installation according to claim 8, wherein said motor and reduction gear unit are located in one of said protective cowlings.

10. An installation according to claim 6, wherein each of said carriages has a frame which is streamlined to facilitate the downward flow of dedusted air over said carriages.

11. An installation according to claim 6, wherein each of said cassette means includes a base and accommodates a batch of vertically oriented semiconductor wafers and each of said carriage includes a frame having a top recess for receiving a respective cassette base, and a through opening to facilitate the flow of air along and between said wafers.

12. A method for handling and processing delicate objects in a dedusted environment, comprising the steps of:

introducing dedusted air into a room proximate to an upper part of said room and removing air from said room at a lower part thereof so as to induce a substantially vertically downward laminar flow of air in the room from said upper part to said lower part, drawing a plurality of motorless carriages, having cassette means containing said delicate objects removably received therein, along rails defining a closed loop path located above work stations for processing said objects, said drawing being accomplished by an endless traction belt adapted to be driven at constant speed parallel to said rails and connected to said carriages, in said upper part of said room, said rails and said belt being located substantially immediately adjacent an area of introduction of said dedusted air so as to be exposed to said substantially vertically downward laminar flowing air free from disturbances in air flow due to said work stations and free from any contaminants generated by said work stations, and at least one of picking up cassette means from said carriages and delivering said cassette means to said work stations and removing said cassette means from said work stations and returning them to said carriages.

* * * * *